(12) United States Patent
Ito et al.

(10) Patent No.: US 6,884,972 B2
(45) Date of Patent: Apr. 26, 2005

(54) CERAMIC PLATE FOR A SEMICONDUCTOR PRODUCING/INSPECTING APPARATUS

(75) Inventors: Yasutaka Ito, Gifu (JP); Yasuji Hiramatsu, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/311,368

(22) PCT Filed: Apr. 23, 2001

(86) PCT No.: PCT/JP01/03470

§ 371 (c)(1), (2), (4) Date: May 9, 2003

(87) PCT Pub. No.: WO02/091457

PCT Pub. Date: Nov. 14, 2002

(65) Prior Publication Data
US 2003/0186183 A1 Oct. 2, 2003

(51) Int. Cl.$^7$ .................................. H01B 3/68
(52) U.S. Cl. ................... 219/444.1; 118/724
(58) Field of Search ............... 219/444.1, 543, 219/544, 546, 390; 118/724, 725; 392/416, 418

(56) References Cited

U.S. PATENT DOCUMENTS

| | | | |
|---|---|---|---|
| 5,324,012 A | 6/1994 | Aoyama et al. | |
| 5,665,260 A | 9/1997 | Kawada et al. | |
| 6,465,763 B1 | 10/2002 | Ito et al. | |
| 6,475,606 B2 | 11/2002 | Niwa | |
| 6,507,006 B1 | 1/2003 | Hiramatsu et al. | |
| 6,677,557 B2 | 1/2004 | Ito et al. | |
| 2002/0043527 A1 | 4/2002 | Ito | |
| 2003/0015521 A1 | 1/2003 | Ito | |

FOREIGN PATENT DOCUMENTS

| | | |
|---|---|---|
| JP | 59-47822 | 3/1984 |
| JP | 61-84037 | 4/1986 |
| JP | 61-197485 | 9/1986 |
| JP | 62-224952 | 10/1987 |
| JP | 1-201826 | 8/1989 |
| JP | 4-325462 | 11/1992 |
| JP | 5-36819 | 2/1993 |
| JP | 5-235149 | 9/1993 |
| JP | 7-280462 | 10/1995 |
| JP | 7-296377 | 11/1995 |
| JP | 2587289 | 12/1996 |
| JP | 9-134951 | 5/1997 |
| JP | 10-72260 | 3/1998 |
| JP | 10-275524 | 10/1998 |
| JP | 11-40330 | 2/1999 |
| JP | 11-74064 | 3/1999 |
| JP | 2943275 | 6/1999 |
| JP | 2000-286330 | 10/2000 |
| JP | 2001-168177 | 6/2001 |

OTHER PUBLICATIONS

U.S. Appl. No. 10/746,081, filed Dec. 29, 2002, Hiramatsu, et al.

(Continued)

Primary Examiner—Sang Paik
(74) Attorney, Agent, or Firm—Oblon, Spivak, McClelland, Maier & Neustadt, P.C.

(57) ABSTRACT

A ceramic heater for a semiconductor producing/examining device including a ceramic substrate having a disc form with a diameter exceeding 200 mm and first and second surfaces, the first surface being a wafer-holding face and the second surface opposing to the first surface, the wafer-holding face being such that a semiconductor wafer is directly put on the wafer-holding face or held apart from the wafer-holding face by a supporting pin. The wafer-holding face has a surface roughness Rmax of 0.1 to 250 μm according to JIS R 0601, and a difference between the surface roughness of the wafer-holding face and surface roughness of the second surface is 50% or less.

14 Claims, 4 Drawing Sheets

OTHER PUBLICATIONS

U.S. Appl. No. 10/755,308, filed Jan. 13, 2004, Hiramatsu, et al.
U.S. Appl. No. 10/766,027, filed Jan. 29, 2004, Ito, et al.
U.S. Appl. No. 09/471,759, filed Dec. 23, 1999, Saito et al.
U.S. Appl. No. 09/462,067, filed Jan. 5, 2001, Furukawa et al.
U.S. Appl. No. 10/345,356, filed Jan. 16, 2003, Ito.
U.S. Appl. No. 09/787,954, filed Mar. 23, 2001, Ito.
U.S. Appl. No. 09/787,816, filed Mar. 23, 2001, Ito.
U.S. Appl. No. 09/787,818, filed Mar. 23. 2001, Ito.
U.S. Appl. No. 09/806,957, filed Apr. 6, 2001, Ito et al.
U.S. Appl. No. 09/926,730, filed Apr. 16, 2001, Hiramatsu et al.
U.S. Appl. No. 09/880,742, filed Jun. 13, 2001, Saito et al.
U.S. Appl. No. 09/880,359, filed Jun. 13, 2001, Saito et al.
U.S. Appl. No. 09/880,379, filed Jun. 13, 2001, Saito et al.
U.S. Appl. No. 09/915,418, filed Jul. 27, 2001, Ito.
U.S. Appl. No. 09/916,682, filed Jul. 30, 2001, Ito.
U.S. Appl. No. 09/890,358, filed Jul. 30, 2001, Ito.
U.S. Appl. No. 09/917,749, filed Jul. 31, 2001, Ito.
U.S. Appl. No. 09/958,689, Oct. 10, 2001, Furukawa et al.
U.S. Appl. No. 09/979,676, Nov. 5, 2001, Zhou.
U.S. Appl. No. 10/048,894, filed Feb. 1, 2002, Furukawa.
U.S. Appl. No. 10/049,539, filed Nov. 7, 2001, Zhou.
U.S. Appl. No. 10/182,099, filed Jul. 24, 2002, Zhou.
U.S. Appl. No. 10/222,928, filed Aug. 19, 2002, Ito.
U.S. Appl. No. 10/265,413, filed Oct. 7, 2002, Ohashi et al.
U.S. Appl. No. 10/356,519, filed Feb. 3, 2003, Ito.
U.S. Appl. No. 10/217,029, filed Aug. 13, 2002, Ito.
U.S. Appl. No. 09/806,477, filed Jun. 25, 2001, Ito et al.
U.S. Appl. No. 09/831,887, filed May 23, 2001, Ito et al.
U.S. Appl. No. 09/807,960, filed May 18, 2001, Hiramatsu et al.
U.S. Appl. No. 09/806,478, filed Jul. 26, 2001, Ito et al.
U.S. Appl. No. 6,507,006, filed Jan. 14, 2003, Hiramatsu et al.
U.S. Appl. No. 09/869,321, filed Oct. 18, 2001, Zhou.
U.S. Appl. No. 6,465,763, filed Oct. 15, 2002, Ito et al.
U.S. Appl. No. 09/026,012, filed Oct. 24, 2001, Hiramatsu et al.
U.S. Appl. No. 09/926,092, filed Dec. 27, 2001, Ito et al.
U.S. Appl. No. 09/926,297, filed Dec. 26, 2001, Hiramatsu et al.
U.S. Appl. No. 09/926,296, filed Dec. 27, 2001, Ito et al.
U.S. Appl. No. 09/926,362, filed Jan. 16, 2002, Hiramatsu et al.
U.S. Appl. No. 09/926,465, filed Feb. 12, 2002, Furukawa et al.
U.S. Appl. No. 09/926,464, filed Jan. 10, 2002, Hiramatsu et al.
U.S. Appl. No. 09/926,499, filed Mar. 26, 2002, Hiramatsu et al.
U.S. Appl. No. 09/926,714, filed Mar. 5, 2002, Ito et al.
U.S. Appl. No. 09/926,713, filed Mar. 5, 2002, Hiramatsu.
U.S. Appl. No. 10/009,174, filed Apr. 21, 2003, Hiramatsu et al.
U.S. Appl. No. 10/019,448, filed Apr. 8, 2002, Ito et al.
U.S. Appl. No. 09/926,800, filed Mar. 19, 2002, Hiramatsu et al.
U.S. Appl. No. 10/019,444, filed Apr. 23, 2002, Hiramatsu et al.
U.S. Appl. No. 6,677,557, filed Jan. 13, 2003, Ito et al.
U.S. Appl. No. 10/019,311, filed Apr. 9, 2002, Hiramatsu et al.
U.S. Appl. No. 10/030,123, filed May 16, 2002, Hiramatsu et al.
U.S. Appl. No. 10/049,293, filed Apr. 30, 2002, Ito et al.
U.S. Appl. No. 10/060,943, filed Jul. 10, 2002, Ito et al.
U.S. Appl. No. 10/048,490, filed Apr. 30, 2002, Ito et al.
U.S. Appl. No. 10/048,979, filed Apr. 26, 2002 Hiramatsu et al.
U.S. Appl. No. 10/069,511, filed Jun 24, 2002, Ito et al.
U.S. Appl. No. 10/069,510, filed Jun. 20, 2002, Hiramatsu et al.
U.S. Appl. No. 10/070,443, filed Jun. 24, 2002, Hiramatsu et al.
U.S. Appl. No. 10/070,441, filed Jun. 26, 2002, Ito et al.
U.S. Appl. No. 10/088,098, filed May 30, 2002, Ito et al.
U.S. Appl. No. 10/088,100, filed Jun. 26, 2002, Ido.
U.S. Appl. No. 10/118,967, filed Apr. 10, 2002, Ito et al.
U.S. Appl. No. 10/111,980, filed Jun. 27, 2002, Ito et al.
U.S. Appl. No. 10/168,527, filed Oct. 18, 2002, Hiramatsu et al.
U.S. Appl. No. 10/181,724, filed Sep. 27, 2002, Hiramatsu et al.
U.S. Appl. No. 10/226,160, filed Aug. 23, 2002, Ito et al.
U.S. Appl. No. 10/229,177, filed Aug. 28, 2002, Hiramatsu et al.
U.S. Appl. No. 10/277,818, filed Oct. 23, 2002, Hiramatsu et al.
U.S. Appl. No. 10/311,368, filed May 9, 2002, Ito et al.
U.S. Appl. No. 10/352,138, filed Jan. 28, 2003, Hiramatsu et al.
U.S. Appl. No. 10/346,095, filed Jan. 17, 2003, Ito et al.
U.S. Appl. No. 10/343,747, filed Aug. 27, 2003, Ito et al.
U.S. Appl. No. 10/344,148, filed Jul. 29, 2003, Kariya et al.
U.S. Appl. No. 10/343,833, filed Sep. 22, 2003, Zhou et al.
U.S. Appl. No. 10/386,615, filed Mar. 13, 2003, Hiramatsu et al.
U.S. Appl. No. 10/387,452, filed Mar. 14, 2003, Ito et al.
U.S. Appl. No. 10/363,310, filed Mar. 3, 2003, Ito.
U.S. Appl. No. 10/397,321, filed Mar. 27, 2003, Hiramatsu et al.
U.S. Appl. No. 10/398,393, filed Jan. 21, 2004, Hiramatsu et al.
U.S. Appl. No. 10/442,967, filed May 22, 2003, Hiramatsu et al.
U.S. Appl. No. 6,475,606, filed Nov. 5, 2002, Niwa.
U.S. Appl. No. 10/260,360, filed Oct. 1, 2002, Niwa.
U.S. Appl. No. 10/615,950, filed Jul. 10, 2003, Hiramatsu et al.
U.S. Appl. No. 10/416,497, filed Dec. 11, 2003, Hiramatsu et al.
U.S. Appl. No. 10/618,651, filed Jul. 15, 2003, Ito et al.
U.S. Appl. No. 10/618,623, filed Jul. 15, 2003, Ito et al.
U.S. Appl. No. 10/618,655, filed Jul. 15, 2003, Ito et al.
U.S. Appl. No. 10/618,665, filed Jul. 15, 2003, Ito et al.
U.S. Appl. No. 10/432,639, filed Nov. 6, 2003, Ito et al.
U.S. Appl. No. 10/619,567, filed Jul. 16, 2003, Hiramatsu et al.
U.S. Appl. No. 10/362,941, filed Apr. 28, 2003, Ito.
U.S. Appl. No. 09/524,010, filed Mar. 13, 2000, Niwa.
U.S. Appl. No. 09/946,463, filed Sep. 6, 2001, Niwa.
U.S. Appl. No. 10/244,008, filed Sep. 16, 2002, Niwa.
U.S. Appl. No. 10/670,354, filed Sep. 26, 2003, Niwa.
U.S. Appl. No. 10/658,454, filed Sep. 10, 2003, Ito et al.

U.S. Appl. No. 10/663,681, filed Sep. 17, 2003, Ito et al.
U.S. Appl. No. 10/473,585, filed Feb. 13, 2004, Ito et al.
U.S. Appl. No. 10/697,287, filed Oct. 31, 2003, Ito et al.
U.S. Appl. No. 10/718,535, filed Nov. 24, 2003, Hiramatsu et al.
U.S. Appl. No. 09/673,953, filed Dec. 21, 2000, Ito et al.
U.S. Appl. No. 10/732,296, filed Dec. 11, 2003, Ito et al.
U.S. Appl. No. 10/759,083, filed Jan. 20, 2004, Hiramatsu, et al.
Material Processing Data File No. 1295 With partial English translation.
Material Processing Data File No. 3573 With partial English translation.
Material Processing Data File No. 3564 With partial English translation.
Reference Material 1 With partial English translation.
Reference Material 2 With partial English translation.
U.S. Appl. No. 10/876,665, filed Jun. 28, 2004, Ito et al.
U.S. Appl. No. 10/901,109, filed Jul. 29, 2004, Hiramatsu et al.
U.S. Appl. No. 10/900,113, filed Jul. 28, 2004, Hiramatsu et al.

CERAMIC PLATE FOR A SEMICONDUCTOR PRODUCING/INSPECTING APPARATUS

TECHNICAL FIELD

The present invention relates to a ceramic plate used mainly in a semiconductor producing/examining device, particularly to a ceramic plate for a semiconductor producing/examining device which a large-sized silicon wafer can be put on and which does not cause any damage of a wafer and the like.

BACKGROUND ART

Semiconductors are very important products necessary in various industries. A semiconductor chip is produced, for example, by slicing a silicon monocrystal into a given thickness to produce a silicon wafer, and then forming various circuits etc. on this silicon wafer.

In such a process for producing semiconductor chips, there are widely used semiconductor producing/examining devices using, as a base thereof, a ceramic substrate such as an electrostatic chuck, a hot plate, a wafer prober, a susceptor and the like.

As such semiconductor producing/examining devices, for example, Japanese Patent gazette No. 2587289 and the publication of JP Kokai Hei 10-72260 disclose ceramic substrates used for these purpose.

All of the ceramic substrates disclosed in the above-mentioned publications and so on have a diameter of about 6 inches (150 mm) or a thickness of 8 mm or more.

However, as silicon wafers have been made large-sized in recent years, ceramic substrates having a diameter of 8 inches or more have been required.

In the process for producing a silicon wafer, it is necessary to use a ceramic substrate in which heating elements are embedded so as to heat the wafer. Furthermore, in order to make the heat capacity thereof small to improve the temperature following character thereof, it has been required to make the thickness thereof less than 10 mm.

According to the publication of JP Kokai Hei 7-280462, in this ceramic heater, the surface roughness of a face on which a silicon wafer is put or above which a silicon wafer is held to keep a given interval between the face and the wafer (referred to as a wafer-putting/holding face hereinafter) according to JIS R 0601 is set as follows: Rmax=less than 2 μm. The above-mentioned surface roughness of the face opposite thereof is adjusted to a roughness sufficient to cause diffused reflection of heat rays, that is Rmax=2 to 200 μm.

SUMMARY OF THE INVENTION

However, when such a ceramic heater wherein heating elements are formed on a large-sized and thin ceramic substrate on which roughening treatment was carried out was utilized, a problem that a warp is generated at a high temperature range arose.

Thus, a cause that such a problem arose was investigated. As a result, it has been found out that the cause is based on the following mechanism.

In this ceramic heater, the surface roughness of the wafer-putting/holding face is smaller than that of the face opposite to the wafer-putting/holding face. Therefore, if Young's modulus thereof drops at high temperature, the face opposite to the wafer-putting/holding face, the roughness of which is larger, becomes somewhat easily extended. As a result, a warp is generated.

Also, in the case that the surface roughness of both main faces of the ceramic substrate is too large, even if the surface roughness of the wafer-putting/holding face is made equal to that of the face opposite to the wafer-putting/holding face, the wafer-putting/holding face contracts more easily and thus a warp is generated. On the other hand, if the surface roughness is made very small to make the face flat, conditions for grinding or blast treatment must be made harsh. For this reason, stress based on grinding treatment and the like remains on the surface of the ceramic substrate, and thus, a warp is rather easily generated since this stress is released at high temperature.

The inventors conducted research repeatedly in order to solve such a problem about the generation of a warp of a ceramic substrate. As a result, it has been found out that by adjusting the surface roughness of both main faces of a ceramic substrate into a given range and adjusting a difference in the surface roughness between its wafer-putting/holding face and the face opposite to the wafer-putting/holding face to 50% or less, the generation of a warp in the ceramic substrate can be prevented. Thus, the present invention has been completed.

That is, the present invention is a ceramic plate comprising a ceramic substrate for a semiconductor producing/examining device, wherein a semiconductor wafer is put on a surface of the ceramic substrate, or is held a given distance apart from the surface of the ceramic substrate, wherein:

the surface roughness of the above-mentioned ceramic substrate according to JIS R 0601 is set as follows: Rmax= 0.1 to 250 μm; and the surface roughness of the wafer-putting/holding face of the above-mentioned ceramic substrate is equal to the surface roughness of the face opposite to the wafer-putting/holding face, or a difference between the surface roughness of the wafer-putting/holding face and the surface roughness of the face opposite to the wafer-putting/holding face is 50% or less.

In the above-mentioned ceramic plate for a semiconductor producing/examining device, the above-mentioned ceramic substrate is preferably in a disc form and has a diameter of 200 mm or more and a thickness of 50 mm or less.

EXPLANATION OF SYMBOLS 10 ceramic heater
11 heater plate
11a wafer-putting/holding face
11b bottom face
12 heating element
12a metal covering layer
13 external terminal
14 bottomed hole
15 through hole
16 supporting pin
19 silicon wafer
20 chuck positive electrostatic layer
30 chuck negative electrostatic layer
20a, 30a connecting electrode
20b, 30b combteeth-shaped electrode
40 ceramic dielectric film
50 resistance heating element
100 ceramic substrate
101 electrostatic chuck

DETAILED DISCLOSURE OF THE INVENTION

The ceramic plate comprising a ceramic substrate for a semiconductor producing/examining device, wherein a semiconductor wafer is put on a surface of the above-mentioned ceramic substrate, or is held a given distance apart from the surface of the above-mentioned ceramic substrate, wherein:

the surface roughness of the above-mentioned ceramic substrate according to JIS R 0601 is set as follows: Rmax= 0.1 to 250 μm; and the surface roughness of the wafer-putting/holding face of the above-mentioned ceramic substrate is equal to the surface roughness of the face opposite to the above-mentioned wafer-putting/holding face, or a difference between the surface roughness of the wafer-putting/holding face and the surface roughness of the above-mentioned face opposite to the above-mentioned wafer-putting/holding face is 50% or less.

The difference in the surface roughness in the present specification is a value calculated by the following equation (1):

Difference (%) in the surface roughness=[(larger surface roughness−smaller surface roughness)/larger surface roughness]×100

Therefore, in the ceramic plate for a semiconductor producing/examining device of the present invention, the surface roughness of the wafer-putting/holding face may be larger, or the surface roughness of the face opposite to the wafer-putting/holding face may be larger.

In the present invention, firstly, the surface roughness of the ceramic substrate according to JIS R 0601 is adjusted as follows: Rmax=0.1 to 250 μm; therefore, there do not arise problems as described in the part of prior art, that is, problems that the wafer-putting/holding face contracts easily or stress remains in the surface. Furthermore, the surface roughness of the wafer-putting/holding face may be adjusted equal to that of the face opposite to the wafer-putting/holding face, or a difference between the surface roughness of the wafer-putting/holding face and that of the face opposite to the wafer-putting/holding face is adjusted to be 50% or less; therefore, no warp owing to the fact that the difference in the surface roughness is too large is generated.

Particularly, the difference in the surface roughness is optimally 20% or less. By setting the difference in the surface roughness to 20% or less, the warp amount of the disc-form ceramic substrate having a diameter of 200 mm or less can be set to 5 μm or less. As a result, the heating property of a semiconductor wafer can be improved and an examination error of a wafer prober can be removed. Moreover, the chuck power of an electrostatic chuck can be improved.

Consequently, even if the silicon wafer or the like is put on this ceramic plate for a semiconductor producing/examining device and is then heated, the silicon wafer is not damaged on the basis of any warp.

The ceramic substrate used in the present invention desirably has a diameter of 200 mm or more and a thickness of 50 mm or less. This is because semiconductor wafers having a diameter of 8 inches or more become the main current and it is required to make semiconductor wafers large-sized.

In ceramic substrates having a large diameter of 8 inches or more, a warp at high temperature is more easily generated, and with this size, the structure of the present invention works effectively.

The diameter of the above-mentioned ceramic substrate is more desirably 12 inches (300 mm) or more. This is because this is a size which will become the main current of semiconductor wafers of the next generation.

The reason why the thickness of the above-mentioned ceramic substrate is preferably 50 mm or less is that if the thickness is over 50 mm, the heat capacity of the ceramic substrate becomes large. Thus, if a temperature control means is set up to heat or cool the ceramic substrate, the temperature following character becomes deteriorated.

In the ceramic substrate whose thickness is as small as 50 mm or less, a warp is easily generated at high temperature. As a result, the structure of the present invention acts effectively.

The thickness of the ceramic substrate is more preferably 5 mm or less. If the thickness is over 5 mm, the heat capacity thereof becomes large so that the temperature controllability and temperature uniformity in the wafer-putting/holding face deteriorate.

As the ceramic plate of the present invention, it is desired to use a ceramic whose Young's modulus at the temperature range of 25 to 800° C. is 280 GPa or more. Such a ceramic is not particularly limited. Examples thereof include nitride ceramics, carbide ceramics and the like.

If the Young's modulus is less than 280 GPa, the rigidity is too low. As a result, it becomes difficult to make the warp amount at the time of heating small.

Examples of the nitride ceramics include aluminum nitride, silicon nitride, boron nitride and the like. Examples of the carbide ceramics include silicon carbide, zirconium carbide, titanium carbide, tantalum carbide, tungsten carbide and the like.

In the case that the above-mentioned aluminum nitride is used, a substance having a composition comprises more than 50% by weight of aluminum nitride is preferred. Examples of some other ceramics used in this case include alumina, sialon, silicon carbide, silicon nitride and the like.

The Young's modulus of the above-mentioned ceramic substrate can be controlled by using a mixture or a lamination of two or more kinds of ceramics, or by adding thereto, for example, an alkali metal, an alkali earth metal, a rare earth metal, carbon and the like. As the above-mentioned alkali metal or the alkali earth metal, Li, Na, Ca, Rb and the like are preferred. As the rare earth metal, Y is preferred. As the carbon, amorphous or crystalline carbon may be used. The carbon content is desirably from 100 to 5000 ppm. Since such content makes it possible to blacken the ceramic plate.

In the present invention, a conductor layer may be disposed inside the ceramic substrate and this conductor layer can be caused to function as, for example, a heating element, a guard electrode, a ground electrode, an electrostatic electrode and the like. A conductor layer may be deposited on a surface of the ceramic substrate and this conductor layer can be caused to function as, for example, a heating element, a chuck top electrode and the like.

Furthermore, plural conductor layers, such as a heating element, a guard electrode and a ground electrode, may be disposed inside the ceramic substrate.

In the case that an electrostatic electrode is set up, the ceramic substrate functions as an electrostatic chuck.

Examples of the material constituting the above-mentioned conductor layer include a metal sintered body, a non-sintered metal body and a sintered body of a conductive ceramic.

As the raw material of the above-mentioned metal sintered body and the non-sintered metal body, for example, a high melting point metal and the like can be used. Examples of the above-mentioned high melting point metal include tungsten, molybdenum, nickel, indium and the like. These may be used alone or in combination of two or more.

Examples of the above-mentioned conductive ceramic include carbides of tungsten and molybdenum.

Such a ceramic plate at which a heating element, a guard electrode, a ground electrode and so on are set up, may be used as, for example, a hot plate (a ceramic heater), an electro static chuck, a wafer prober and the like.

Figure 1:
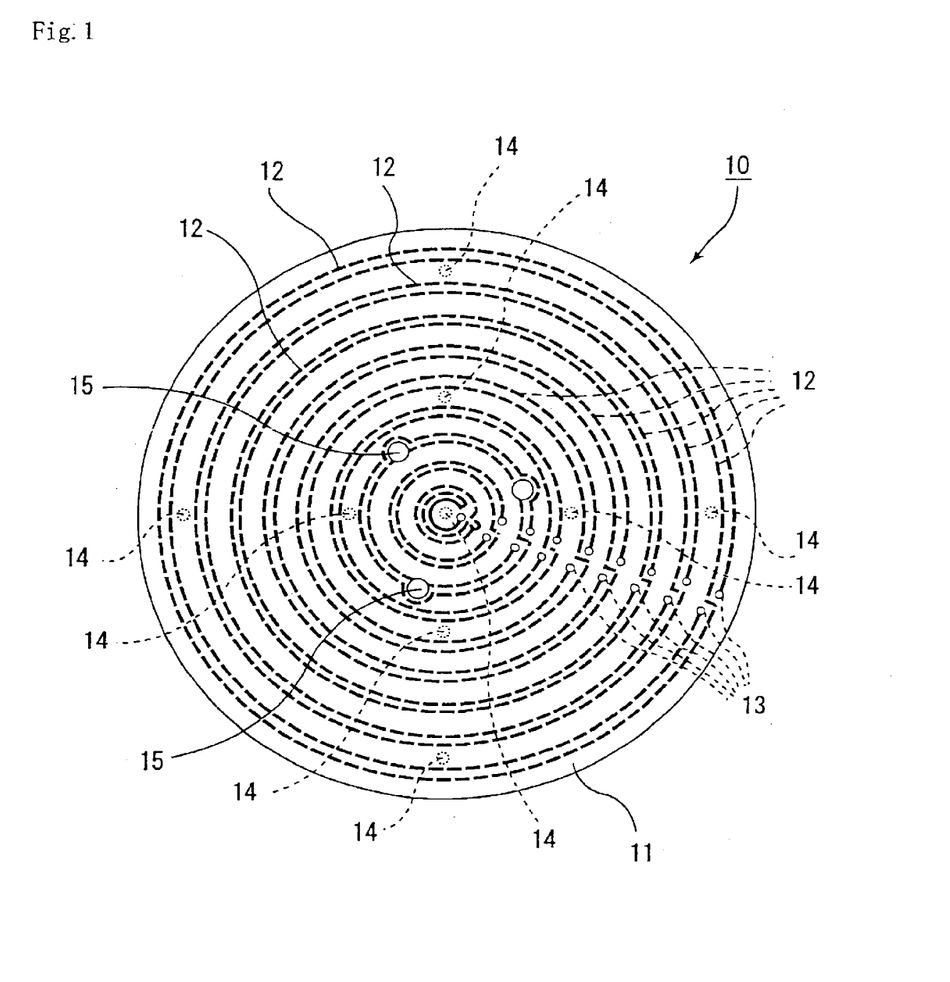
FIG. 1 is a plan view that schematically illustrates a ceramic heater, which is one example of the ceramic plate for a semiconductor producing/examining device of the present invention.
Figure 2:
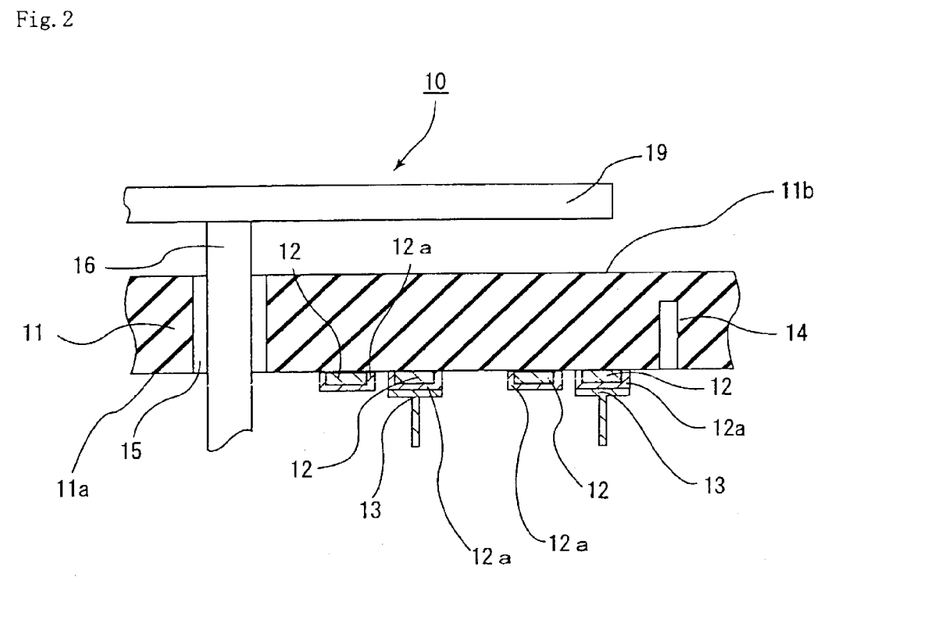
FIG. 2 is a sectional view that schematically illustrates a part of the ceramic heater illustrated in FIG. 1.

FIG. 1 is a plan view that schematically shows an example of a ceramic heater that is one embodiment of the ceramic plate for a semiconductor producing/examining device of the present invention. FIG. 2 is a partially enlarged cross section view that schematically shows a part of the above-mentioned ceramic heater.

A ceramic substrate 11 is made in a disk form. Heating elements 12 are made in the pattern of concentric circles on the bottom face of the ceramic substrate 11, in order to heat the wafer-putting/holding face of the ceramic substrate 11 so as to make the temperature of the whole of the wafer-putting/holding face uniform.

About these heating elements 12, two concentric circles near to each other, as a pair, are connected so as to produce one line, and external terminal pins 13, which will be inputting/outputting terminal pins, are connected to both ends thereof. Through holes 15, into which supporting pins 16 will be inserted, are made in an area near the center. Moreover, bottomed holes 14, into which temperature-measuring elements will be inserted, are made.

As shown in FIG. 2, the supporting pins 16, on which a silicon wafer 19 can be put and can be moved up and down. By the supporting pins, the silicon wafer 19 can be delivered to a non-illustrated carrier machine or the silicone wafer 19 can be received from the carrier machine.

The heating elements 12 may be formed inside the ceramic substrate 11 and at the center thereof or at positions biased from the center toward the wafer-putting/holding face.

Examples of the pattern of the resistance heating elements 12 include concentric circuits, a spiral, eccentric circuits, and winding lines and the like. The pattern in the form of concentric circuits, as illustrated in FIG. 1, is preferred since the pattern makes it possible to make the temperature of the whole of the heater plate uniform.

In order to form the heating elements 12 inside the ceramic substrate or on the bottom face of the ceramic substrate, it is desired to use a conductor containing paste made of a metal or a conductive ceramic.

That is, in the case that the heating elements are formed inside the ceramic substrate, the resistance heating elements are made by: forming a conductor containing paste on a green sheet; and subsequently laminating and firing such green sheets. On the other hand, in the case that the heating elements are formed on the surface, the heating elements are usually made by performing firing to manufacture a ceramic substrate, forming a conductor containing paste layer on a surface thereof, and firing the resultant.

The above-mentioned conductor containing paste is not particularly limited, and is preferably a paste comprising not only metal particles or a conductive ceramic for keeping electrical conductivity but also a resin, a solvent, a thickener and so on.

The above-mentioned metal particles are preferably made of, for example, a noble metal (gold, silver, platinum or palladium), lead, tungsten, molybdenum, nickel and the like. These may be used alone or in combination of two or more. These metals are relatively hard to be oxidized, and have a resistance value sufficient for generating heat.

Examples of the above-mentioned conductive ceramic include carbides of tungsten and molybdenum. These may be used alone or in combination of two or more. The particle diameter of these metal particles or the conductive ceramic particles is preferably from 0.1 to 100 $\mu$m. If the particle diameter is too fine, that is, less than 0.1 $\mu$m, they are easily oxidized. On the other hand, if the particle diameter is over 100 $\mu$m, they are not easily sintered so that the resistance value becomes large.

The shape of the above-mentioned metal particles may be spherical or scaly. When these metal particles are used, they may be a mixture of spherical particles and scaly particles.

In the case that the above-mentioned metal particles are made of scaly particles or a mixture of spherical particles and scaly particles, a metal oxide between the metal particles is easily retained and adhesiveness between the heating elements 12 and a nitride ceramic and the like is secured. Moreover, the resistance value can be made large. Thus, this case is profitable.

Examples of the resin used in the conductor containing paste include epoxy resins, phenol resins and the like. Examples of the solvent are isopropyl alcohol and the like. Examples of the thickener are cellulose and the like.

In the above-mentioned conductor containing paste, a metal oxide is preferably added to the metal particles, and the heating elements 12 are desirably made up to a sintered body of the metal particles and the metal oxide, as described above. By sintering the metal oxide together with the metal particles in this way, the nitride ceramic, which is the ceramic substrate, can be closely adhered to the metal particles.

The reason why the adhesiveness to the nitride ceramic and the like is improved by mixing the above-mentioned metal oxide is unclear, but would seem to be based on the following. The surface of the metal particles or the surface of the nitride ceramic is slightly oxidized so that an oxidized film is formed thereon. Pieces of this oxidized film are sintered and integrated with each other through the metal oxide so that the metal particles and the nitride ceramic and the like are closely adhered to each other.

As an example of the metal oxide, at least one selected from the group consisting of lead oxide, zinc oxide, silica, boron oxide ($B_2O_3$), alumina, yttria, and titania is preferable.

These oxides make it possible to improve adhesiveness between the metal particles and the nitride ceramic without increasing the resistance value of the heating elements 12.

When the total amount of the metal oxides is adjusted to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total thereof is not over 100 parts by weight.

By adjusting the amounts of these oxides within these ranges, the adhesiveness to the nitride ceramic can be particularly improved.

The addition amount of the metal oxide to the metal particles is preferably 0.1% by weight or more and less than 10% by weight. The area resistivity when the conductor containing paste having such a structure is used to form the heating elements 12 is preferably from 1 to 45 mΩ/□.

If the area resistivity is over 45 mΩ/□, the calorific value for an applied voltage becomes too large so that in the ceramic substrate 11 wherein heating elements 12 are set on its surface their calorific value is not easily controlled. If the addition amount of the metal oxide is 10% or more by weight, the area resistivity exceeds 50 mΩ/□ so that the calorific value becomes too large. Thus, temperature control becomes difficult so that uniformity of temperature distribution deteriorates.

In the case that the heating elements 12 are formed on the surface of the ceramic substrate 11, a metal covering layer 12a is preferably formed on the surface of the heating elements 12, as illustrated in FIG. 2. The metal covering layer prevents a change in the resistance value based on oxidization of the inner metal sintered body. The thickness of the formed metal covering layer 12a is preferably from 0.1 to 10 µm.

The metal used when the metal covering layer 12a is formed is not particularly limited if the metal is non-oxidizable. Specific examples thereof include gold, silver, palladium, platinum, nickel and the like. These may be used alone or in combination of two or more. Among these metals, nickel is preferred.

In the present invention, thermocouples may be embedded in the ceramic substrate if necessary. With the thermocouples, the temperature of the heating elements is measured, and on the basis of the data voltage or electric current amount is changed to control the temperature.

The size of the connecting portions of metal wires of the thermocouples is the same as the strand diameter of the respective metal wires, and the size is preferably 0.5 mm or more. Such a structure makes the heat capacity of the connecting portion small, and causes temperature to be correctly and speedy converted to an electric current value. For this reason, temperature controllability is improved so that temperature distribution in the heated surface of the wafer becomes small.

Examples of the above-mentioned thermocouple include K, R, B, S, E, J and T type thermocouples, as described in JIS-C-1602 (1980).

Next, the following will describe the process for manufacturing the ceramic plate for a semiconductor producing/examining device of the present invention.

First, a process for manufacturing the ceramic plate wherein the heating elements 12 are formed on the bottom face of the ceramic substrate 11 shown in FIG. 1 will be described.

(1) Step of Forming the Ceramic Plate

A slurry is prepared by blending powder of a nitride ceramic, such as the above-mentioned aluminum nitride with, if necessary, a sintering aid such as yttria, a binder and so on. Thereafter, this slurry is made into a granular form by spray-drying and the like. The granule is put into a mold and pressed to be formed into a plate form and the like form. Thus, a raw formed body (green) is formed.

Next, portions which will be the through holes 15, into which the supporting pins 16 for supporting a silicon wafer will be inserted, and portions which will be the bottomed holes 14, into which temperature-measuring elements such as thermocouples will be embedded are made in the raw formed body if necessary.

Next, this raw formed body is heated and fired to be sintered. Thus, a plate made of the ceramic is manufactured. Thereafter, the plate is made into a given shape to manufacture the ceramic substrate 11. The shape of the raw formed body may be such a shape that the sintered body can be used as it is. By heating and firing the raw formed body under pressure, the ceramic substrate 11 having no pores can be manufactured. It is sufficient that the heating and the firing are performed at sintering temperature or higher. The heat firing temperature is from 1000 to 2500° C. for the nitride ceramic.

(2) Step of Printing a Conductor Containing Paste on the Ceramic Substrate

A conductor containing paste is generally a fluid comprising metal particles, a resin and a solvent, and has a high viscosity. This conductor containing paste is printed in portions where heating elements are to be arranged by screen printing and the like, to form a conductor containing paste layer. Since it is necessary that the heating elements make the temperature of the whole of the ceramic substrate uniform, the conductor containing paste is desirably printed into a pattern of concentric circles, as shown in FIG. 1.

The conductor containing paste layer is desirably formed in such a manner that a section of the heating elements 12 subjected to the firing will be rectangular and flat.

(3) Firing of the Conductor Containing Paste

The conductor containing paste layer printed on the bottom face of the ceramic substrate 11 is heated or fired to remove the resin and the solvent and sinter the metal particles. Thus, the metal particles are baked onto the bottom face of the ceramic substrate 11 to form the heating elements 12. The heating and firing temperature is preferably from 500 to 1000° C.

If the above-mentioned metal oxide is added to the conductor containing paste, the metal particles, the ceramic substrate and the metal oxide are sintered to be integrated with each other. Thus, the adhesiveness between the heating elements and the ceramic substrate is improved.

(4) Forming a Metal Covering Layer

A metal covering layer 12a is desirably deposited on the surface of the heating elements 12 (reference to FIG. 2). The metal covering layer 12a can be formed by electroplating, electroless plating, sputtering and the like. From the viewpoint of mass-productivity, electroless plating is optimal.

(5) Fitting of Terminals and So On

External terminals 13 for connection to a power source are fitted up to ends of the pattern of the heating elements 12 with solder. Thermocouples are inserted into the bottomed holes 14. The bottomed holes are sealed with a heat resistant resin, such as a polyimide, or a ceramic, so as to manufacture the ceramic heater 10.

The following will describe a process for manufacturing a ceramic plate wherein heating elements are formed inside a ceramic substrate.

(1) Step of Forming the Ceramic Substrate

First, powder of a nitride ceramic is mixed with a binder, a solvent and so on to prepare a paste. This is used to form a green sheet.

As the above-mentioned ceramic powder, aluminum nitride, and the like can be used. If necessary, a sintering aid such as yttria and the like may be added.

The amount of yttria is preferably 5% or more by weight. This is because 1% or more by weight of yttrium can be caused to remain in the sintered body and the Young's modulus thereof can be adjusted to 280 GPa or more in the temperature range of 25 to 800° C.

In the case that the remaining amount of yttrium is less than 1% by weight, the Young's modulus thereof is less than 280 GPa at about 25° C. Thus, this case is unfavorable.

As the binder, desirable is at least one selected from an acrylic binder, ethylcellulose, butylcellusolve, and polyvinyl alcohol.

As the solvent, desirable is at least one selected from α-terpineol and glycol.

A paste obtained by mixing these is formed into a sheet form by doctor blade process, to produce a green sheet.

The thickness of the green sheet is preferably from 0.1 to 5 mm.

Next, the following are made in the resultant green sheet if necessary: portions which will be through holes into which supporting pins for supporting a silicon wafer will be inserted; portions which will be bottomed holes in which temperature-measuring elements such as thermocouples will be embedded; portions which will be conductor-filled through holes for connecting the heating elements to external terminal pins; and the like. After a green sheet lamination that will be described later is formed, the above-mentioned processing may be performed.

(2) Step of Printing a Conductor Containing Paste on the Green Sheet

A metal paste or a conductor containing paste containing a conductive ceramic is printed on the green sheet.

This conductor containing paste contains metal particles or conductive ceramic particles.

The average particle diameter of tungsten particles or molybdenum particles is preferably from 0.1 to 5 $\mu$m. If the average particle is less than 0.1 $\mu$m or over 5 $\mu$m, the conductor containing paste is not easily printed.

Such a conductor containing paste may be a composition (paste) obtained by mixing, for example, 85 to 87 parts by weight of the metal particles or the conductive ceramic particles; 1.5 to 10 to parts by weight of at least one binder selected from acrylic binders, ethylcellulose, butylcellusolve and polyvinyl alcohol; and 1.5 to 10 parts by weight of at least one solvent selected from α-terpineol and glycol.

(3) Step of Laminating the Green Sheets

Green sheets on which no conductor containing paste is printed are laminated on the upper and lower sides of the green sheet on which the conductor containing paste is printed.

At this time, the number of the green sheets laminated on the upper side is made larger than that of the green sheets laminated on the lower side to cause the position where the heating elements are formed to be biased toward the bottom face.

Specifically, the number of the green sheets laminated on the upper side is preferably from 20 to 50, and that of the green sheets laminated on the lower side is preferably from 5 to 20.

(4) Step of Firing the Green Sheet Lamination

The green sheet lamination is heated and pressed to sinter the green sheets and the inner conductor containing paste.

Heating temperature is preferably from 1000 to 2000° C., and pressing pressure is preferably from 10 to 20 MPa (100 to 200 kg/cm$^2$). The heating is performed in the atmosphere of an inert gas. As the inert gas, argon, nitrogen and the like can be used.

After the firing, bottomed holes into which temperature-measuring elements will be inserted may be made. The bottomed holes can be made by drilling or blast treatment such as sandblast after surface-grinding. Terminals are connected to the conductor-filled through holes for the connection of the inside heating elements, and are heated and reflowed. Heating temperature is suitably from 90 to 110° C. in the case of treatment with solder. The heating temperature is suitably from 900 to 1100° C. in the case of treatment with brazing material.

Furthermore, thermocouples and the like as temperature-measuring elements are fixed with a heat-resistant resin to obtain a ceramic heater.

BEST MODE FOR CARRYING OUT THE INVENTION

The present invention will be described in more detailed hereinafter.

EXAMPLE 1

Ceramic Heater (1) The following paste was used to conduct formation by a doctor blade method, to obtain green sheets 0.47 mm in thickness: a paste obtained by mixing 100 parts by weight of aluminum nitride powder (made by Tokuyama Corp., average particle diameter: 1.1 $\mu$m), 4 parts by weight of yttria (average particle diameter: 0.4 $\mu$m), 11.5 parts by weight of an acrylic binder, 0.5 part by weight of a dispersant and 53 parts by weight of alcohol comprising 1-butanol and ethanol.

(2) Next, this green sheet was dried at 80° C. for 5 hours, and subsequently through holes having a diameter of 1.8 mm, 3.0 mm and 5.0 mm were made by punching. These through holes were portions which would be through holes into which supporting pins for supporting a silicon wafer would be inserted; and portions which would be conductor-filled through holes; and so on.

(3) The following were mixed to prepare a conductor containing paste A: 100 parts by weight of tungsten carbide particles having an average particle diameter of 1 $\mu$m, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 $\mu$m, 1.9 parts by weight of an acrylic binder, 3.7 parts by weight of α-terpineol solvent, and 0.2 part by weight of a dispersant.

This conductor containing paste A was printed on the green sheet by screen printing, so as to form a conductor containing paste layer for heating elements. The printed pattern was a concentric circular pattern as illustrated in FIG. 1. Thirty-seven green sheets on which no printing processing was performed were stacked on the upper side (heating face side) of the green sheet subjected to the above-mentioned processing, and the same thirteen green sheets were stacked on the lower side of the green sheet. The resultant was pressed and integrated at 130° C. and under a pressure of 8 MPa (80 kg/cm$^2$) to form a lamination.

The conductor containing paste B was filled into the through hole portions which would be the conductor-filled through holes.

(4) Next, the resultant lamination was degreased at 600° C. in the atmosphere of nitrogen gas for 5 hours and hot-pressed at 1890° C. and under a pressure of 15 MPa (150 kg/cm$^2$) for 10 hours to obtain an aluminum nitride plate having a thickness of 3 mm. This was cut off into a disk form having a diameter of 300 mm to prepare a ceramic heater having heating elements therein having a thickness of 6 $\mu$m and a width of 10 mm. Next, sandblast treatment of blowing SiC having an average particle diameter of 2.5 μm against both faces thereof was conducted, to make the surface roughness of the wafer-putting/holding face: Rmax=2 μm and that of the opposite face: Rmax=2.3 μm according to JIS B 0601, respectively.

About the size of the conductor-filled through holes, the diameter thereof was 0.2 mm and the depth thereof was 0.2 mm.

(5) Next, the plate obtained in the above-mentioned (4) was ground with a diamond grindstone. Subsequently, a mask was put thereon, and bottomed holes 14 for thermocouples were made in the surface by blast treatment with SiC and the like.

(6) Furthermore, blind holes having a diameter of 5 mm and a depth of 0.5 mm were made by drilling. Brazing gold made of Ni—Au (Au: 81.5% by weight, Ni: 18.4% by weight, and impurities: 0.1% by weight) was used, heated and reflowed at 970° C. to connect external terminals made of kovar to the blind holes.

The external terminals were made to have a structure of being supported and connected by means of three metal layers comprising tungsten.

(7) Next, thermocouples for controlling temperature were buried in the bottomed holes to finish the production of a ceramic heater.

EXAMPLE 2

(1) A composition made of 100 parts by weight of aluminum nitride powder (average particle diameter: 1.1 μm), 4 parts by weight of yttria (average particle diameter: 0.4 μm), 12 parts by weight of an acrylic binder and an alcohol was subjected to spray-drying to make granular powder.

(2) Next, this granular powder was put into a mold and formed into a flat plate form to obtain a raw formed body (green).

(3) The raw formed body subjected to the working treatment was hot-pressed at 1800° C. and under a pressure of 20 MPa (200 kg/cm$^2$) to obtain a nitride aluminum plate body having a thickness of 3 mm.

Next, this plate was cut out into a disk having a diameter of 300 mm, and then sandblast treatment of blowing alumina particles having an average particle diameter of 5 μm against both faces thereof was conducted, to make the surface roughness of the wafer-putting/holding face: Rmax=7 μm and that of the opposite face: Rmax=7.5 μm according to JIS B 0601, respectively.

Furthermore, this formed body was drilled to make portions which would be through holes 15 into which supporting pins for a semiconductor wafer would be inserted, and portions (diameter: 1.1 mm, depth: 2 mm) which would be bottomed holes 14 into which thermocouples would be embedded.

(4) A conductor containing paste was printed on the plate subjected to the above-mentioned treatment (3) by screen printing. The printed pattern was a concentric circular pattern as illustrated in FIG. 1.

The used conductor containing paste was Solvest PS603D made by Tokuriki Kagaku Kenkyu-sho, which is used to form conductor-filled through holes in print circuit boards.

This conductor containing paste was a silver-lead paste and contained 7.5 parts by weight of metal oxides made of lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(5) Next, the heater plate 11 on which the conductor containing paste was printed was heated and fired at 780° C. to sinter silver and lead in the conductor containing paste and bake them onto the heater plate 11. Thus, heating elements 12 were formed. The silver-lead heating elements had a thickness of 5 μm, a width of 2.4 mm and an area resistivity of 7.7 mΩ/□.

(6) The heater plate 11 formed in the above-mentioned (5) was immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 12a having a thickness of 1 μm on the surface of the silver-lead heating elements 12.

(7) By screen printing, a silver-lead solder paste (made by Tanaka Kikinzoku Kogyo K. K.) was printed on portions onto which external terminal 13 for attaining connection to a power source would be set up, to form a solder layer.

Next, external terminals 13 made of Kovar were put on the solder layer, heated and reflowed at 420° C. to attach the external terminals 13 onto the surface of the heating elements.

(8) Thermocouples for controlling temperature were fixed with a polyimide to obtain a ceramic heater 10.

EXAMPLE 3

Figure 3:
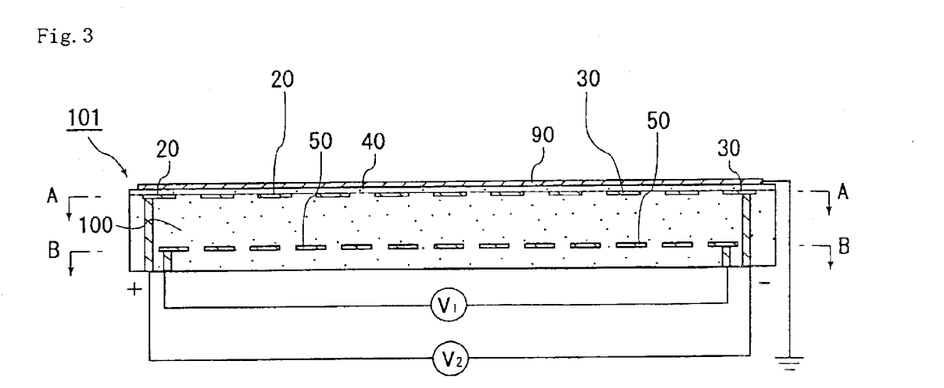
FIG. 3 is a longitudinal sectional view that schematically illustrates an electrostatic chuck, which is one example of the ceramic plate for a semiconductor producing/examining device of the present invention.
Figure 4:
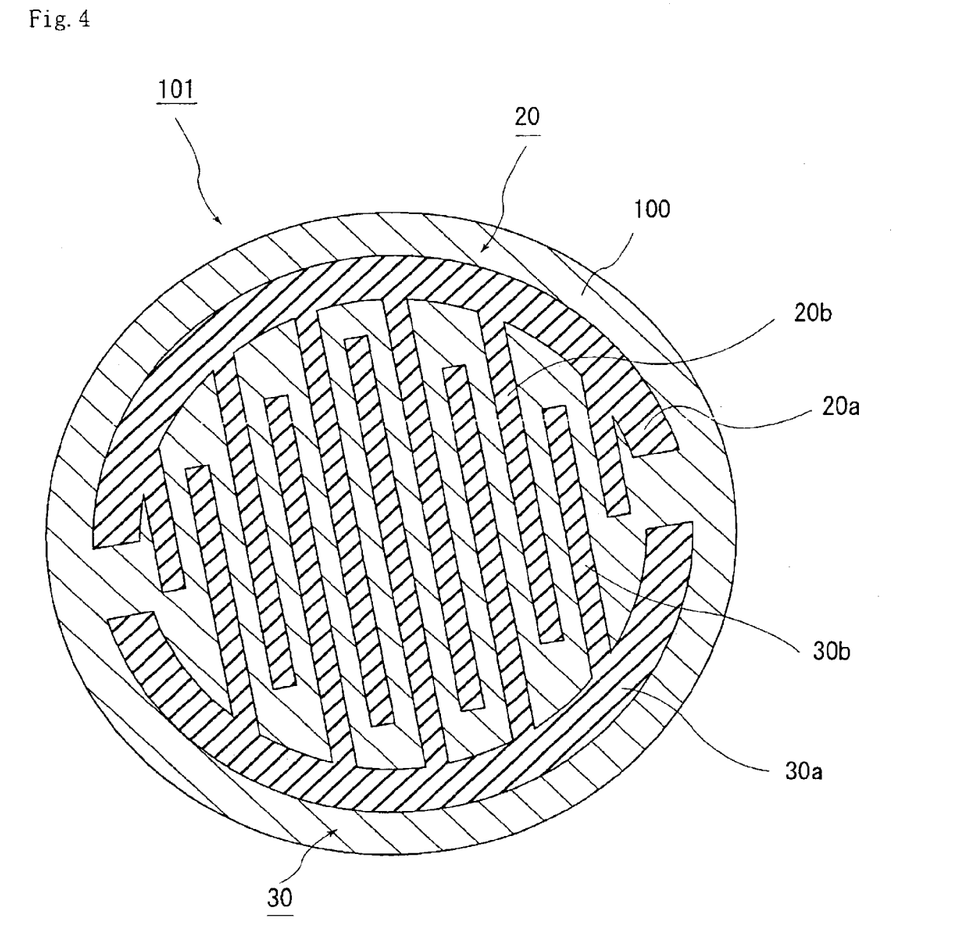
FIG. 4 is a sectional view taken on A—A line of the electrostatic chuck illustrated in FIG. 3.
Figure 5:
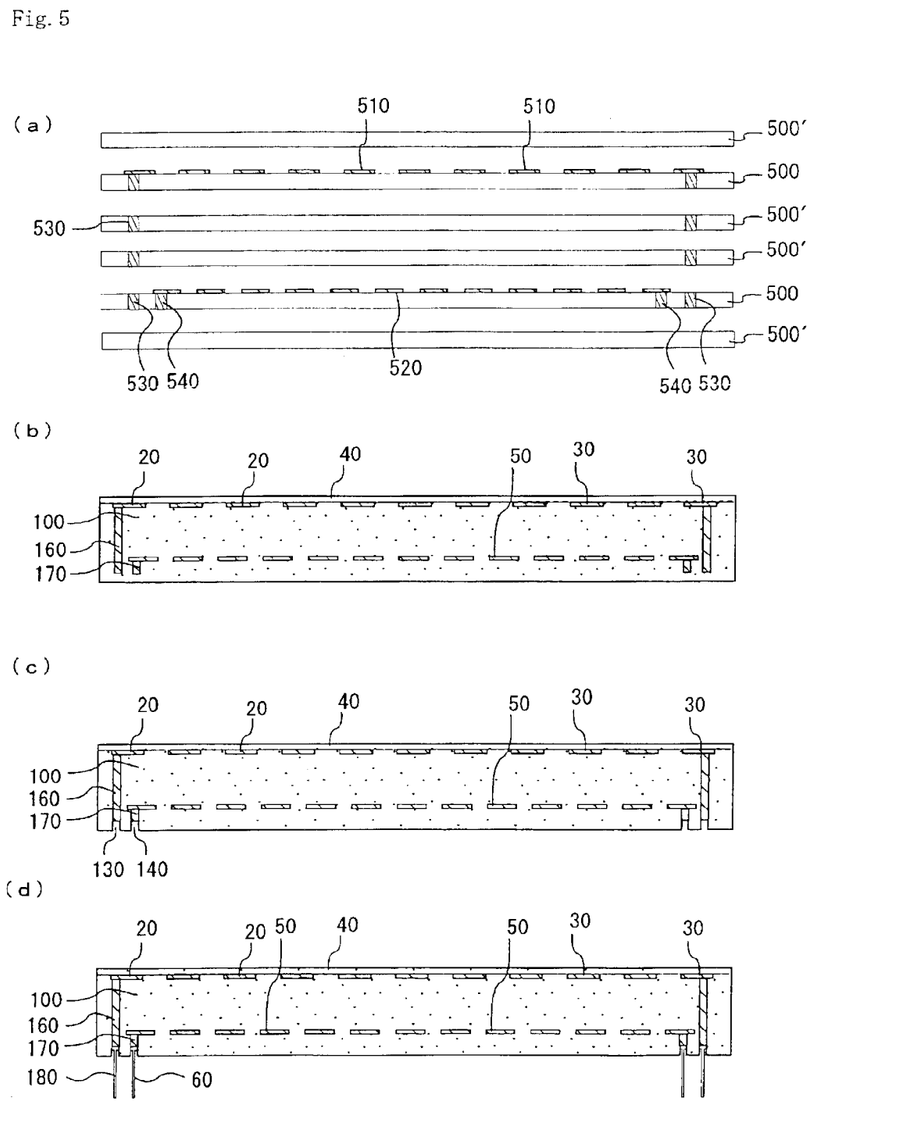
FIGS. 5(a) to (d) are sectional views that schematically illustrate a process for manufacturing the electrostatic chuck.

Production of an Electrostatic Chuck (Reference to FIGS. 3 to 5)

(1) The following paste was used to conduct formation by a doctor blade method, to obtain green sheets 0.47 mm in thickness: a paste obtained by mixing 100 parts by weight of aluminum nitride powder (made by Tokuyama Corp., average particle diameter: 1.1 μm), 4 parts by weight of yttria (average particle diameter: 0.4 μm), 11.5 parts by weight of an acrylic binder, 0.5 part by weight of a dispersant, 0.2 part by weight of saccharose and 53 parts by weight of alcohol comprising 1-butanol and ethanol.

(2) Next, this green sheet was dried at 80° C. for 5 hours, and subsequently portions which would be through holes into which semiconductor wafer supporting pins having a diameter of 1.8 mm, 3.0 mm and 5.0 mm would be inserted, and portions which would be conductor-filled through holes for attaining connection to external terminals were made.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing, so as to form a conductor containing paste layer. The printed pattern was a concentric circular pattern. A conductor containing paste layer of an electrostatic electrode pattern having the shape illustrated in FIG. 4 was formed on other green sheets.

The conductor containing paste B was filled into the through holes for conductor-filled through holes for connecting external terminals.

Thirty four green sheets 500' on which no tungsten paste was printed were stacked on the upper side (heating face side) of the green sheet 500 on which the pattern of the resistance heating elements was formed, and the same thirteen green sheets were stacked on the lower side of the green sheet. One green sheet 500 on which the conductor containing paste layer of the electrostatic electrode pattern was printed was stacked thereon, and further two green sheets 500' on which no tungsten paste was printed were stacked thereon. The resultant was pressed at 130° C. and under a pressure of 8 MPa (80 kg/cm$^2$) to form a lamination (FIG. 5(a)).

(4) Next, the resultant lamination was degreased at 600° C. in the atmosphere of nitrogen gas for 5 hours and hot-pressed at 1890° C. and under a pressure of 15 MPa (150 kg/cm$^2$) for 3 hours to obtain an aluminum nitride plate having a thickness of 3 mm. This was cut off into a disk having a diameter of 230 mm to prepare a plate made of aluminum nitride and having therein resistance heating elements 50 having a thickness of 6 μm and a width of 10 mm and chuck positive electrostatic layer 20 and chuck negative electrostatic layer 30 having a thickness of 10 μm (FIG. 5(b)).

(5) Next, the plate obtained in the above-mentioned (4) was ground with a diamond grindstone. Subsequently a mask was put thereon, and bottomed holes (diameter: 1.2 mm, and depth: 2.0 mm) for thermocouples were made in the surface by blast treatment with SiC and the like. The roughness of the ceramic surface at this time was as follows: Rmax=3 μm.

The wafer-putting/holding face was ground to make the face as follows: Rmax=1.5 μm.

(6) Furthermore, portions in which the conductor-filled through holes were made were hollowed out to make blind holes 130 and 140 (FIG. 5(c)). Brazing gold made of Ni—Au was used, heated and reflowed at 700° C. to connect external terminals made of Kovar 60 and 180 to the blind holes 130 and 140 (FIG. 5(d)).

About the connection of the external terminals, a structure wherein a support of tungsten is supported at three points is desirable. This is because the reliability of the connection can be kept.

(7) Next, thermocouples for controlling temperature were buried in the bottomed holes to finish the production of an electrostatic chuck having the resistance heating elements.

In the finished electrostatic chuck (FIG. 3), the heater (resistance heating element) pattern 50 and the positive and negative chuck electrostatic layers (electrostatic electrodes) 20 and 30 were embedded in the ceramic substrate 100. As illustrated in FIG. 4, as the positive and negative chuck electrostatic layers (electrostatic electrodes) 20 and 30, combteeth-shaped electrodes 20b and 30b confront each other and connecting electrodes 20a and 30a for electrically connecting the combteeth-shaped electrodes exist.

A ceramic dielectric film 40 having a thickness of about 300 μm was formed on the positive and negative chuck electrostatic layer (electrostatic electrodes) 20 and 30. The thickness of ceramic dielectric film 40 can be set into the range of 50 to 2000 μm.

EXAMPLE 4

The same manufacturing process as in Example 3 was performed. However, both faces of the ceramic substrate 100 were subjected to sandblast treatment in the (5), and the surface roughness of both faces was made as follows: Rmax=3 μm.

Comparative Example 1

In the present Comparative Example, an aluminum nitride plate was obtained in the same way as in the (1) to (4) of Example 1. Thereafter, sandblast treatment of blowing SiC particles having an average particle diameter of 0.5 μm against the wafer-putting face was conducted. On the other hand, sandblast treatment of blowing SiC particles having an average particle size of 5 μm against the opposite face was conducted. Thereafter, in the same way as in the (5) to (7) of Example 1, a ceramic heater was obtained.

The surface roughness of the wafer-putting/holding face of the resultant ceramic heater was: Rmax=1 μm and that of the opposite face was: Rmax=4.8 μm according to JIS B 0601, respectively.

Comparative Example 2

In the present Comparative Example, an aluminum nitride plate was obtained in the same way as in the (1) to (4) of Example 1. Thereafter, sandblast treatment of blowing SiC particles having an average particle diameter of 0.1 μm against both faces thereof was conducted. Thereafter, in the same way as in the (5) to (7) of Example 1, a ceramic heater was obtained.

The surface roughness of the wafer-putting/holding face of the resultant ceramic heater was: Rmax=0.08 μm and that of the opposite face was: Rmax=0.07 μm according to JIS B 0601, respectively.

Comparative Example 3

In the present Comparative Example, an aluminum nitride plate was obtained in the same way as in the (1) to (4) of Example 1. Thereafter, sandblast treatment of blowing SiC particles having an average particle diameter of 250 μm against both faces thereof was conducted. Thereafter, in the same way as in the (5) to (7) of Example 1, a ceramic heater was obtained.

The surface roughness of the wafer-putting/holding face of the resultant ceramic heater was: Rmax=260 μm and that of the opposite face was: Rmax=210 μm according to JIS B 0601, respectively.

Reference Example

The same manufacturing process as in Comparative Example 1 was performed. However, the diameter was made to 150 mm (6 inches).

Evaluation Method

The ceramic heaters obtained in Examples 1 and 2 and Comparative Examples 1 to 3 were heated to 600° C., and then the temperatures thereof were made return to room temperature. Thereafter, the warp amounts thereof were examined. The warp amounts were measured with a determinator "Nanoway", made by Kyocera Corp. The results are shown in Table 1.

TABLE 1

| | Difference (%) in surface roughness between the wafer-putting face and the opposite face | Warp amount (μm) |
|---|---|---|
| Example 1 | 13 | 3 |
| Example 2 | 7 | 3 |
| Example 3 | 50 | 6 |
| Example 4 | 0 | 2 |
| Comparative Example 1 | 79 | 10 |
| Comparative | 13 | 10 |

TABLE 1-continued

|  | Difference (%) in surface roughness between the wafer-putting face and the opposite face | Warp amount (μm) |
|---|---|---|
| Example 2 |  |  |
| Comparative Example 3 | 19 | 10 |
| Reference Example | 79 | 5 |

As shown in Table 1, in the ceramic heaters according to Examples 1 and 2, Rmax thereof was within the range of 0.1 to 250 μm, and the difference in surface roughness between both faces was as small as 13% (Example 1), and 7% (Example 2). Therefore, the warp amount thereof was as small as 3 μm (Examples 1 and 2). On the other hand, in the ceramic heater according to Comparative Example 1, the difference in surface roughness between both faces was as large as 79%; therefore, the warp amount thereof was also as large as 10 μm. In the ceramic heater according to Comparative Example 2, the values of the surface roughness of both faces were too small; therefore, a warp owing to stress was generated and the warp amount was also as large as 10 μm. In the ceramic heater according to Comparative Example 3, the values of the surface roughness of both faces were too large; therefore, the warp amount was as large as 10 μm.

In the case that the diameter is less than 200 mm as seen in Reference Example, a warp is hardly generated.

INDUSTRIAL APPLICABILITY

As described above, according to the ceramic plate for a semiconductor producing/examining device of the present invention, the surface roughness of both main faces of its ceramic substrate is adjusted into the above-mentioned given range and the difference in surface roughness between its wafer-putting/holding face and the opposite face is adjusted to 50% or less; therefore, it is possible to prevent the generation of a warp of the ceramic substrate and the generation of damage and the like of a silicon wafer based on this warp.

What is claimed is:

1. A ceramic heater for a semiconductor producing/examining device comprising a ceramic substrate having a disc form with a diameter exceeding 200 mm and first and second surfaces, the first surface being a wafer-holding face and the second surface opposing to the first surface, the wafer-holding face being configured to hold a semiconductor wafer directly in contact with the wafer-holding face without an intervening layer, wherein the wafer-holding face has a surface roughness Rmax of 0.1 to 250 μm according to JIS R 0601, and a difference between the surface roughness of the wafer-holding face and a surface roughness of the second surface is 50% or less.

2. The ceramic heater for a semiconductor producing/examining device according to claim 1, wherein said ceramic substrate has a thickness of 50 mm or less.

3. The ceramic heater for a semiconductor producing/examining device according to claim 1, wherein the difference between the surface roughness of the wafer holding face and the surface roughness of the second surface is between 7% and 50%.

4. The ceramic heater for a semiconductor producing/examining device according to claim 1, wherein said ceramic substrate has a diameter of 300 mm or more.

5. The ceramic heater for a semiconductor producing/examining device according to claim 1, wherein said ceramic substrate comprises at least one of nitride ceramic and a carbide ceramic.

6. The ceramic heater for a semiconductor producing/examining device according to claim 1, wherein said ceramic substrate has a thickness of 5 mm or less.

7. The ceramic heater for a semiconductor producing/examining device according to claim 1, wherein the surface roughness of the wafer-holding face is equal to the surface roughness of the second surface.

8. A ceramic heater for a semiconductor producing/examining device comprising:

a ceramic substrate having a disc form with a diameter exceeding 200 mm and first and second surfaces, the first surface being a wafer-holding face and the second surface opposing to the first surface; and at least one supporting pin configured to hold a semiconductor wafer apart from the wafer-holding face without an intervening layer therebetween, wherein the wafer-holding face has a surface roughness Rmax of 0.1 t 250 μm according to JIS R 0601, and a difference between the surface roughness of the wafer-holding face and a surface roughness of the second surface is 50% or less.

9. The ceramic heater for a semiconductor producing/examining device according to claim 8, wherein said ceramic substrate has a thickness of 50 mm or less.

10. The ceramic heater for a semiconductor producing/examining device according to claim 8, wherein the difference between the surface roughness of the wafer-holding face and the surface roughness of the second surface is between 7% and 50%.

11. The ceramic heater for a semiconductor producing/examining device according to claim 8, wherein said ceramic substrate has a diameter of 300 mm or more.

12. The ceramic heater for a semiconductor producing/examining device according to claim 8, wherein said ceramic substrate comprises at least one of a nitride ceramic and a carbide ceramic.

13. The ceramic heater for a semiconductor producing/examining device according to claim 8, wherein said ceramic substrate has a thickness of 5 mm or less.

14. The ceramic heater for a semiconductor producing/examining device according to claim 8, wherein the surface roughness of the wafer-holding face is equal to the surface roughness of the second surface.

* * * * *

UNITED STATES PATENT AND TRADEMARK OFFICE
CERTIFICATE OF CORRECTION

PATENT NO. : 6,884,972 B2
DATED : April 26, 2005
INVENTOR(S) : Yasutaka Ito et al.

It is certified that error appears in the above-identified patent and that said Letters Patent is hereby corrected as shown below:

Column 16,
Line 31, delete "t" and insert -- to --.

Signed and Sealed this

Second Day of August, 2005

JON W. DUDAS
*Director of the United States Patent and Trademark Office*